United States Patent
Micheloni et al.

(10) Patent No.: US 9,397,701 B1
(45) Date of Patent: *Jul. 19, 2016

(54) SYSTEM AND METHOD FOR LIFETIME SPECIFIC LDPC DECODING

(71) Applicant: Microsemi Storage Solutions (US), Inc., Aliso Viejo, CA (US)

(72) Inventors: Rino Micheloni, Turate (IT); Peter Z. Onufryk, Flanders, NJ (US); Alessia Marelli, Dalmine (IT); Christopher I. W. Norrie, San Jose, CA (US)

(73) Assignee: Microsemi Storage Solutions (US), Inc., Aliso Viejo, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 13/792,831

(22) Filed: Mar. 11, 2013

(51) Int. Cl.
  *H03M 13/37* (2006.01)
  *H03M 13/11* (2006.01)
  *G06F 11/10* (2006.01)
  *H03M 13/13* (2006.01)

(52) U.S. Cl.
  CPC .......... *H03M 13/13* (2013.01); *G06F 11/1012* (2013.01); *G11C 2211/5634* (2013.01); *H03M 13/1111* (2013.01); *H03M 13/3723* (2013.01)

(58) Field of Classification Search
  CPC ..................... H03M 13/1111; H03M 13/3723; H03M 13/3769; H03M 13/13; H03M 13/1102; G06F 11/00; G06F 11/1012; G06F 11/1048; G06F 11/1008; G11C 11/5642; G11C 16/10; G11C 16/26; G11C 16/28; G11C 2211/5634
  USPC ............... 714/763, 780, E11.034; 365/185.2, 365/185.18, 185.24
  See application file for complete search history.

(56) References Cited

U.S. PATENT DOCUMENTS

| | | |
|---|---|---|
| 5,615,235 A | 3/1997 | Kakuishi et al. |
| 5,732,092 A | 3/1998 | Shinohara |
| 6,115,788 A | 9/2000 | Thowe |
| 6,539,515 B1 | 3/2003 | Gong |
| 6,633,856 B2 | 10/2003 | Richardson et al. |
| 6,895,547 B2 | 5/2005 | Eleftheriou et al. |
| 6,934,804 B2 | 8/2005 | Hashemi |
| 6,976,194 B2 | 12/2005 | Cypher |
| 6,976,197 B2 | 12/2005 | Faust et al. |
| 7,206,992 B2 | 4/2007 | Xin |
| 7,209,527 B2 | 4/2007 | Smith et al. |
| 7,237,183 B2 | 6/2007 | Xin |
| 7,324,559 B2 | 1/2008 | McGibney |
| 7,450,668 B2 | 11/2008 | Ghosh et al. |

(Continued)

*Primary Examiner* — Albert Decady
*Assistant Examiner* — Kyle Vallecillo
(74) *Attorney, Agent, or Firm* — Kenneth Glass; Mark Peloquin; Glass & Associates

(57) ABSTRACT

A nonvolatile memory storage controller is provided for delivering log likelihood ratios (LLRs) to a low-density parity check (LDPC) decoder for use in the decoding of an LDPC encoded codeword. The controller includes read circuitry for reading an LDPC encoded codeword stored in a nonvolatile memory storage module using a plurality of soft-decision reference voltages to provide a plurality of soft-decision bits representative of the codeword. The controller further includes a plurality of lifetime specific LLR look-up tables representative of the lifetime threshold voltage distribution of the memory storage module, wherein each of the plurality of lifetime specific LLR look-up tables comprises a plurality of LLRs representative of a specific point in the lifetime of the memory storage module for each of the plurality of soft-decision bits. The controller provides the LLRs from the appropriate LLR look-up table to an LDPC decoder for the subsequent decoding of the codeword.

22 Claims, 7 Drawing Sheets

(56) References Cited

U.S. PATENT DOCUMENTS

| | | |
|---|---|---|
| 7,457,906 B2 | 11/2008 | Pettey et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,694,047 B1 | 4/2010 | Alston |
| 7,752,346 B2 | 7/2010 | Talayco et al. |
| 7,801,233 B1 | 9/2010 | Chow et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,245,112 B2 | 8/2012 | Hicken et al. |
| 8,245,117 B1 | 8/2012 | Wu |
| 8,254,112 B2 | 8/2012 | Yang et al. |
| 8,255,770 B2 | 8/2012 | Park et al. |
| 8,261,136 B2 | 9/2012 | D'Abreu et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,359,522 B2 | 1/2013 | Gunnam et al. |
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,640,005 B2 | 1/2014 | Wilkerson et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,775,913 B2 | 7/2014 | Haratsch et al. |
| 8,917,734 B1 | 12/2014 | Brown |
| 8,924,824 B1 | 12/2014 | Lu |
| 8,958,247 B2 | 2/2015 | Asaoka et al. |
| 8,995,302 B1 | 3/2015 | Brown et al. |
| 9,025,495 B1 | 5/2015 | Brown et al. |
| 9,058,289 B2 | 6/2015 | Tai et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0286511 A1 | 12/2005 | Johnsen et al. |
| 2006/0039370 A1 | 2/2006 | Rosen et al. |
| 2006/0126728 A1 | 6/2006 | Yu et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0136628 A1 | 6/2007 | Doi et al. |
| 2007/0147489 A1 | 6/2007 | Sun et al. |
| 2007/0233939 A1 | 10/2007 | Kim |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2008/0267081 A1 | 10/2008 | Roeck |
| 2008/0276156 A1 | 11/2008 | Gunnam et al. |
| 2009/0067320 A1 | 3/2009 | Rosenberg et al. |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0327802 A1 | 12/2009 | Fukutomi |
| 2010/0085076 A1 | 4/2010 | Danilin et al. |
| 2010/0162075 A1 | 6/2010 | Brannstrom et al. |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0293440 A1 | 11/2010 | Thatcher |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim |
| 2011/0296084 A1 | 12/2011 | Nango |
| 2012/0051144 A1* | 3/2012 | Weingarten et al. ..... 365/185.24 |
| 2012/0054413 A1 | 3/2012 | Brandt |
| 2012/0096192 A1 | 4/2012 | Tanaka et al. |
| 2012/0141139 A1 | 6/2012 | Bakhru et al. |
| 2012/0166690 A1 | 6/2012 | Regula |
| 2012/0311402 A1* | 12/2012 | Tseng et al. .................. 714/763 |
| 2013/0013983 A1 | 1/2013 | Livshitz et al. |
| 2013/0086451 A1 | 4/2013 | Grube et al. |
| 2013/0117616 A1 | 5/2013 | Tai et al. |
| 2013/0117640 A1 | 5/2013 | Tai et al. |
| 2013/0145235 A1* | 6/2013 | Alhussien et al. ............ 714/773 |
| 2013/0163327 A1 | 6/2013 | Karakulak et al. |
| 2013/0163328 A1* | 6/2013 | Karakulak et al. ......... 365/185.2 |
| 2013/0176779 A1 | 7/2013 | Chen et al. |
| 2013/0185598 A1 | 7/2013 | Haratsch et al. |
| 2013/0315252 A1 | 11/2013 | Emmadi et al. |
| 2013/0318422 A1 | 11/2013 | Weathers et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0072056 A1 | 3/2014 | Fay |
| 2014/0085982 A1 | 3/2014 | Asaoka et al. |
| 2014/0181617 A1 | 6/2014 | Wu et al. |
| 2014/0185611 A1 | 7/2014 | Lie et al. |
| 2014/0198581 A1 | 7/2014 | Kim et al. |
| 2014/0281767 A1 | 9/2014 | Alhussien et al. |
| 2014/0281822 A1 | 9/2014 | Wu et al. |
| 2015/0149871 A1 | 5/2015 | Chen et al. |
| 2015/0186055 A1 | 7/2015 | Darragh |

* cited by examiner

SYSTEM AND METHOD FOR LIFETIME SPECIFIC LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. Additionally, the bit error rate (BER) of the flash memory changes over the lifetime of the device. It is well known that NAND flash memory program/erase (PE) cycling gradually degrades the storage reliability of the memory device and stronger ECC techniques may be necessary over the lifetime of the device to ensure the data integrity. The lifetime of a flash block may be defined as the maximum number of P/E cycles after which the ECC in the SSD controller can no longer ensure the required storage reliability within a specific guaranteed data storage time. The gradual wear-out of the flash memory, as a result of the P/E cycling, undesirably diminishes the memory cell noise margin and increases the raw bit error rate (RBER) of the device.

One commonly employed error correction code for nonvolatile memory storage modules, such as SSDs, is the low-density parity-check (LDPC) code. An LDPC code is a linear error correcting code having a parity check matrix with a small number of nonzero elements in each row and column. Soft-decision message passing algorithms are known in the art for decoding data encoded with LDPC error correction codes, such as sum-product algorithm (SPA) and min-sum algorithm. These soft-decision message passing algorithms are iterative in nature and attempt to decode the encoded data by assigning probability metrics to each bit in an encoded code word. The probability metrics indicate a reliability of each bit, that is, how likely it is that the bit read from the memory is not in error. These probability metrics are commonly referred to log likelihood ratios (LLRs) in the case of LDPC decoding. These LLRs values are often stored in LLR look-up tables, which are accessible by the NAND flash controller.

NAND-based flash storage suffers from low endurance as each flash memory cell can tolerate only a limited number of program/erase (P/E) cycles. Due to the program/erase wear-out of the flash memory, the bit error rate (BER) of the memory device typically increases during its lifetime and as such, more error correction coding will be needed to guarantee the integrity of the stored data as the devices ages. It follows that the log likelihood ratios (LLRs) of the flash memory device also change over the lifetime of the device, as the LLR values are measures of the reliability of the data read from the memory storage. However, LDPC decoders currently known in the art do not address the changes in the LLRs associated with the flash memory during the lifetime of the device. Instead, prior art LDPC decoders are designed for a maximum bit error rate (BER) that does not change during the memory device lifetime.

Accordingly, what is needed in the art is an improved system and method for decoding LDPC encoded data, wherein the LLR values are adjustable to compensate for the wear-out of the NAND memory cells over the lifetime of the flash memory device.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code and accessed by a nonvolatile memory storage controller. A decoder receives the LDPC encoded data stored in the nonvolatile memory storage module from the controller and attempts to decode and recover the data.

A method of providing log likelihood ratios (LLRs) to a low-density parity check (LDPC) decoder is provided which includes, reading an LDPC encoded codeword stored in a nonvolatile memory storage module using a plurality of soft-decision reference voltages to provide a plurality of soft-decision bits representative of the codeword. After the soft-decision bits are determined, the method of the present then accesses a lifetime specific LLR look-up table for the nonvolatile memory storage module, wherein the lifetime specific LLR look-up table comprises an LLR representative of a current point in the lifetime of the nonvolatile memory storage module for each of the plurality of soft-decision bits. The LLRs are then extracted from the lifetime specific LLR look-up table for each of the soft-decision bits and provided to an LDPC decoder for use in the decoding of the codeword.

In a particular embodiment, the nonvolatile memory storage module may be a NAND-based flash memory module providing either single-level cell (SLC) or multi-level (MLC) memory storage.

The lifetime specific LLR look-up table may be one of a plurality of lifetime specific LLR look-up tables stored in a memory controller, wherein each of the plurality of LLR tables represents the threshold voltage distribution at a particular point in the lifetime of the nonvolatile memory storage module.

In a particular embodiment, the lifetime specific LLR look-up table may be asymmetric, thereby representative of an asymmetric threshold distribution of the nonvolatile memory storage module.

A nonvolatile memory storage module controller of the present invention may include read circuitry for reading an LDPC encoded codeword stored in a nonvolatile memory storage module using a plurality of soft-decision reference voltages to provide a plurality of soft-decision bits representative of the codeword. The controller may further include a plurality of lifetime specific LLR look-up tables representative of the lifetime threshold voltage distribution of the nonvolatile memory storage module, wherein each of the plurality of lifetime specific LLR look-up tables comprises a plurality of LLRs representative of a specific point in the lifetime of the nonvolatile memory storage module for each of the plurality of soft-decision bits. The controller may also include circuitry to extract the LLRs from the lifetime specific LLR look-up table for each of the soft-decision bits and to provide the extracted LLRs to an LDPC decoder for decoding of the codeword.

In a particular embodiment, the nonvolatile memory storage module may be a NAND-based flash memory module providing either single-level cell (SLC) or multi-level (MLC) memory storage.

In a particular embodiment, the lifetime specific LLR lookup table may be asymmetric, thereby representative of an asymmetric threshold distribution of the nonvolatile memory storage module.

The present invention provides an improved system and method for decoding LDPC encoded data, wherein the LLR values are adjustable to compensate for the wear-out of the NAND memory cells over the lifetime of the flash memory device.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1A:
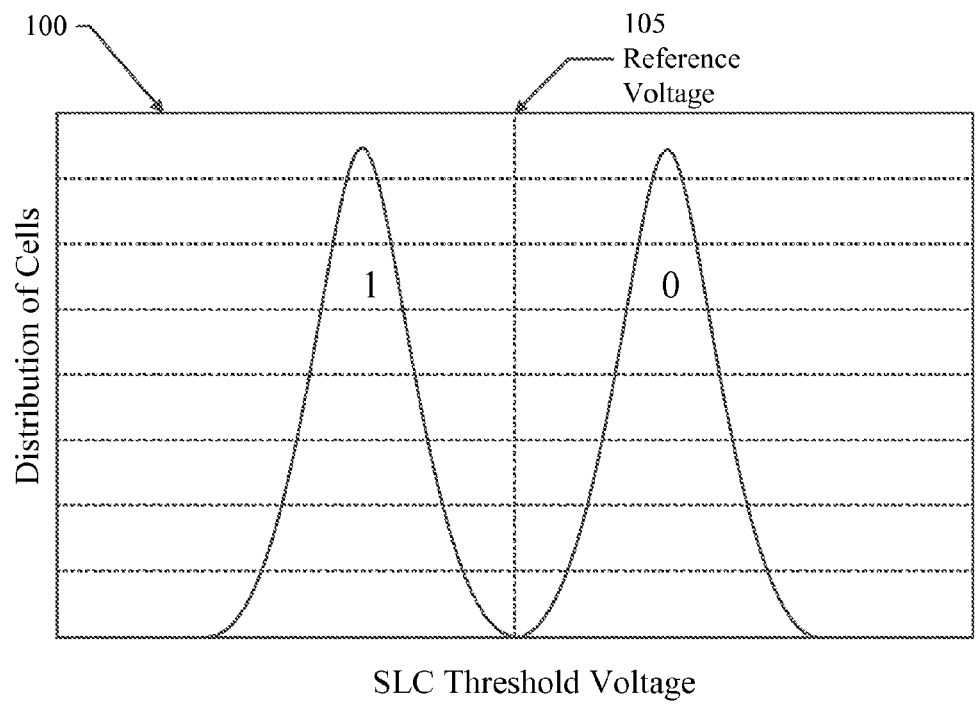
FIG. 1A is a graphical illustration of a possible threshold voltage distribution for a single-level cell at the beginning of its lifetime.

In the operation of a stored channel utilizing LDPC encoding, original data are stored in a non-volatile memory, such as a NAND-based flash memory. Different noise sources estimated as White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

The bit error rate (BER) of the flash memory changes over the lifetime of the device. It is well known that NAND flash memory program/erase (P/E) cycling gradually degrades the storage reliability of the memory device. Flash memory P/E cycling causes damage to the tunnel oxide of the floating gate transistors in the form of charge trapping in the oxide and interface states. This charge trapping directly results in a shifting of the threshold voltage and gradually degrades the memory device noise margin. Additionally, the BER may change over the lifetime of the flash memory due to a decrease in retention time resulting from the P/E cycling of the device.

Each NAND storage element can store one, or multiple, bits of data. In the case of a single-level cell (SLC), the NAND storage element is designed to store one bit of data. The graph 100 of FIG. 1A illustrates a typical SLC threshold voltage distribution for a distribution of flash cells. As illustrated in the graph 100 of FIG. 1A, the range of possible threshold voltages of the SLC NAND cells is divided into two ranges, wherein one range is designated as representative of a logical "1" and the other range is designated as representative of a logical "0". The two ranges are separated by the reference voltage 105. In a particular example, the value of the reference voltage 105 may be zero and the threshold voltage of the cell is negative after the cell is erased and is defined as a logical "1".

Figure 1B:
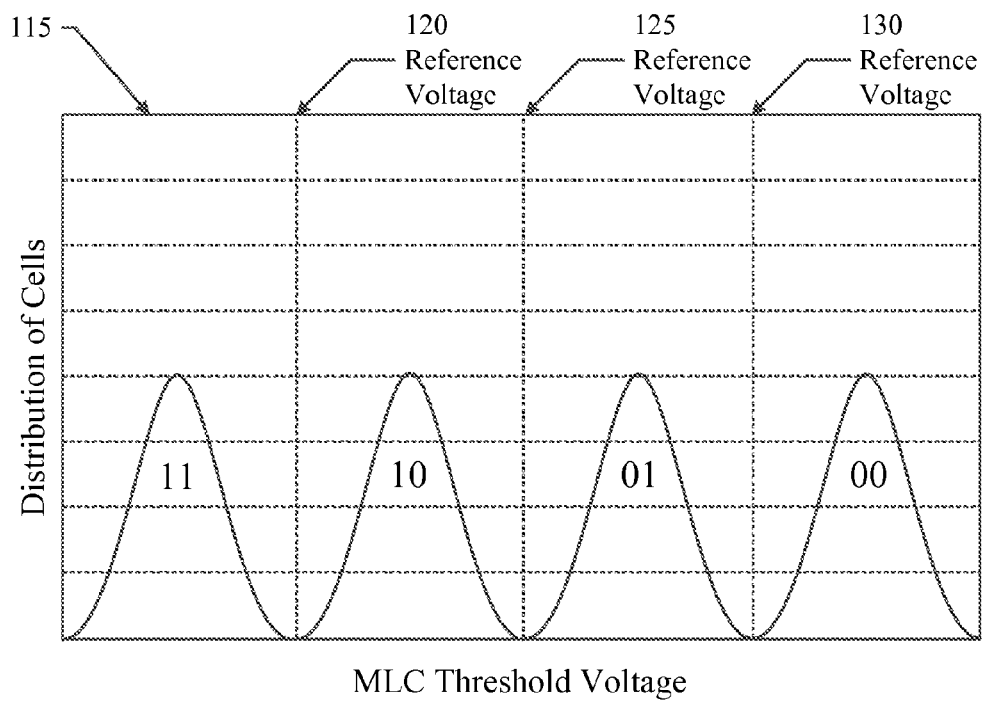
FIG. 1B is a graphical illustration of a possible threshold voltage distribution for a multi-level cell at the beginning of its lifetime.

In the case of an n-bit multi-level cell (MLC) NAND flash memory, the threshold voltage of each cell can be programmed to $2^n$ separate states. The graph 115 of FIG. 1B illustrates a typical MLC threshold voltage distribution for a distribution of flash cells. In the illustrated case of a 2-bit MLC, each of the possible states of the cell, "11", "10", "01" and "00", corresponds to a non-overlapping threshold voltage range, as illustrated in the graph 115 of FIG. 1B. The ranges are bounded by the reference voltages 120, 125 and 130. In a particular example, the value of the reference voltage 120 may be zero and the lowest threshold voltage of the cell "11" may indicate and erased state with the remaining threshold voltages "10", "01", and "00" indicating a programmed state. In a particular embodiment, the NAND flash memory device may be capable of storing 3 bits per cell, and is commonly referred to as a triple level cell (TLC)

FIG. 1 illustrates the threshold voltage distributions for a typical SLC and MLC flash memory device at the beginning of the device lifetime. As is shown, at the beginning of the flash device lifetime, the threshold voltage distributions do not overlap and are symmetrical about the reference voltage (s). However, during the lifetime of the flash memory, the threshold voltage distributions may become distorted or shifted as a result of P/E cycling and loss of charge over time. While MLCs can store more data, the lifetime of MLCs tends to be considerably shorter than that of SLCs because there is much less separation between the levels of charge that represent the states in the MLCs and as such, they more quickly lose their ability to successfully store varying levels of voltage. As a result of the shift in the voltage distributions over the lifetime of both the SLC and MLC devices, the previously non-overlapping threshold voltage ranges may begin to overlap as illustrated with reference to FIG. 2. This overlap results in memory read errors which may be corrected utilizing LDPC encoding and decoding techniques.

The power of LDPC codes resides in the ability of the decoding strategy to exploit the soft information of the stored data. In LDPC decoding of single-level (SLC) flash memory, the two voltage distributions represent the two possible states, "0" and "1", of the cells within the NAND chips. When the voltage distributions overlap 210, as shown with reference to the graph 200 of FIG. 2, errors arise. A hard-decision decoder will read all the values to the right of the reference voltage 205 as 0 and all the values to the left of the reference voltage 205 as 1. So, in the situation depicted in the graph 200, the overlap region 210 will be composed of read errors. However, observing error points A and B within the overlap region 205, it is clear that the error points may vary in magnitude. The farther away the error points are from the reference voltage 205, the more probable it is that the cell contains the value that was stored. For example, point A is slightly to the right of the reference voltage and as such, slightly positive, while point B is farther away from the reference voltage 205. As such, it is more likely that point A carries the greater error because correct values should not be close to the reference voltage. Alternatively, point B is considered to carry less error than point A and is more likely to be read correctly. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). As such, in FIG. 2, error point A would be presented to the LDPC decoder as a value of zero and assigned a low magnitude LLR (probability) due to its close proximity to the reference voltage 205, whereas error point B would be presented to the LDPC decoder as a value of zero and assigned a moderate magnitude LLR (probability) due to its greater distance from the reference voltage 205. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the log likelihood ratio (LLR) of the received data bits in the codeword, as in the equation:

$$LLR(x) = \log\left[\frac{p(x \mid y = 0)}{p(x \mid y = 1)}\right]$$

where "y" is the read message and "x" is the original codeword. As such, the LLR for a particular read value of "y" is the logarithmic ratio between the probability that the bit of the original codeword "x" was a 0 given the read value "y" and the probability that the bit "x" was a 1 given the read value "y". As such, the magnitude of the LLRs measure the probability that the bit is read correctly vs. the probability that the bit is read incorrectly. When performing decoding of the codeword, the LLRs are propagated and updated between the variable nodes and the check nodes in a Tanner graph, which is representative of the parity check matrix of the LDPC code.

Figure 2:
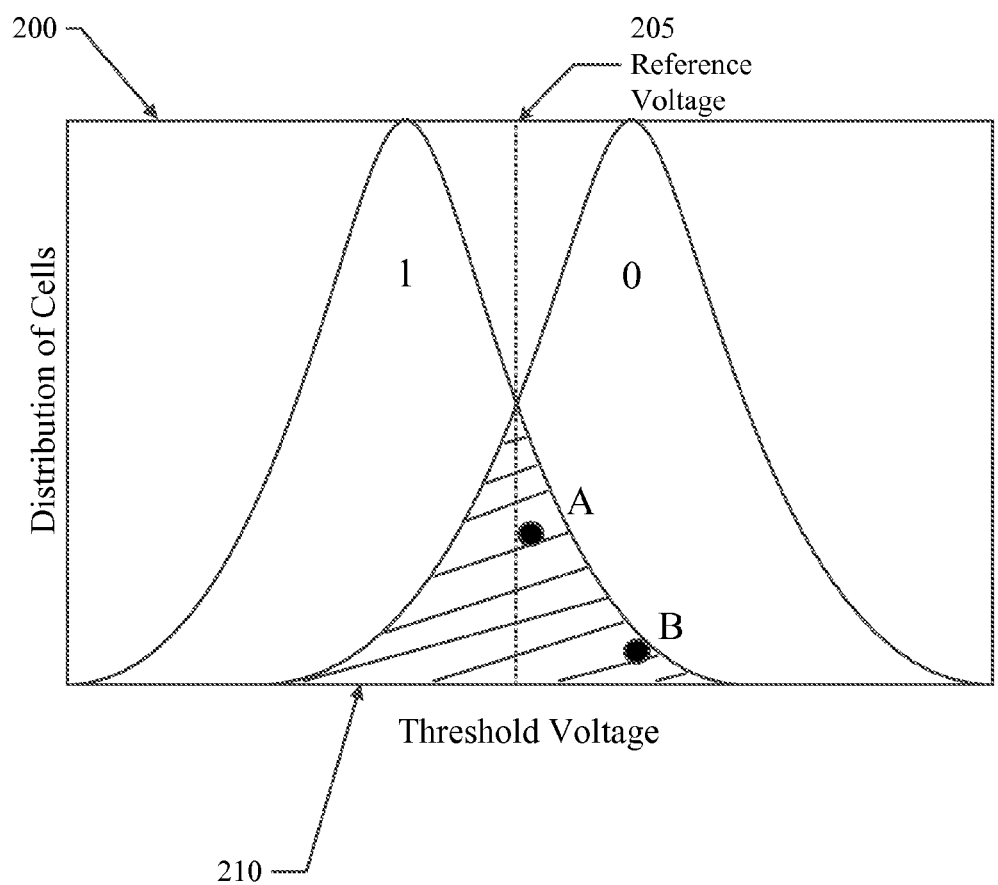
FIG. 2 is a graphical illustration of a symmetric overlapping threshold voltage distribution in a single-level cell.

The threshold voltage distribution overlap illustrated in FIG. 2 will occur if both the erase distribution and programmed distributions widen and shift substantially symmetrically such that the overlap 210 is equally distributed around the reference voltage 205. However, in the case of a flash memory device, generally it is found that the erase distribution widens more than the programmed distribution over the lifetime of the device. As shown with reference to the graph 300 of FIG. 3, over the lifetime of the flash memory, an overlap region 310 may be created that is asymmetric and shifted to the right of the reference voltage 305 as a result of the erase distribution "1" widening more rapidly than the programmed distribution "0". While this asymmetric distribution 310 is shown in this case for an SLC flash memory, the lack of symmetry may be even more extreme in the case of an MLC flash memory having multiple programmed states.

To perform a successful read operation on the NAND-based flash memory device employing LDPC encoding, a plurality of read operations are performed at various read reference voltage levels, by applying the read reference voltage to the corresponding control gate of the cell to see if the sensed cell conducts at that particular read reference voltage. The responses of the cell for each of the read reference voltages are then used to determine the value of the bit stored by the cell. The conventional design practice is to employ uniform distribution for sensing the cells, wherein the soft-decision reference voltages are uniformly distributed between two consecutive hard-decision reference voltages. However, since the area where most errors will occur is in the overlap of the threshold voltage distributions, and since most of the overlap between two adjacent states occurs in the vicinity of the corresponding hard-decision reference voltages, the present invention employs non-uniform partitioning of the threshold voltage distribution to improve the quality of the soft information. As such, by concentrating the soft-decision reference voltages around the hard-decision reference voltages and within the overlap regions, the same number of sensing voltages can be used in a non-uniform way to provide better information for determining the bit value.

Figure 4:
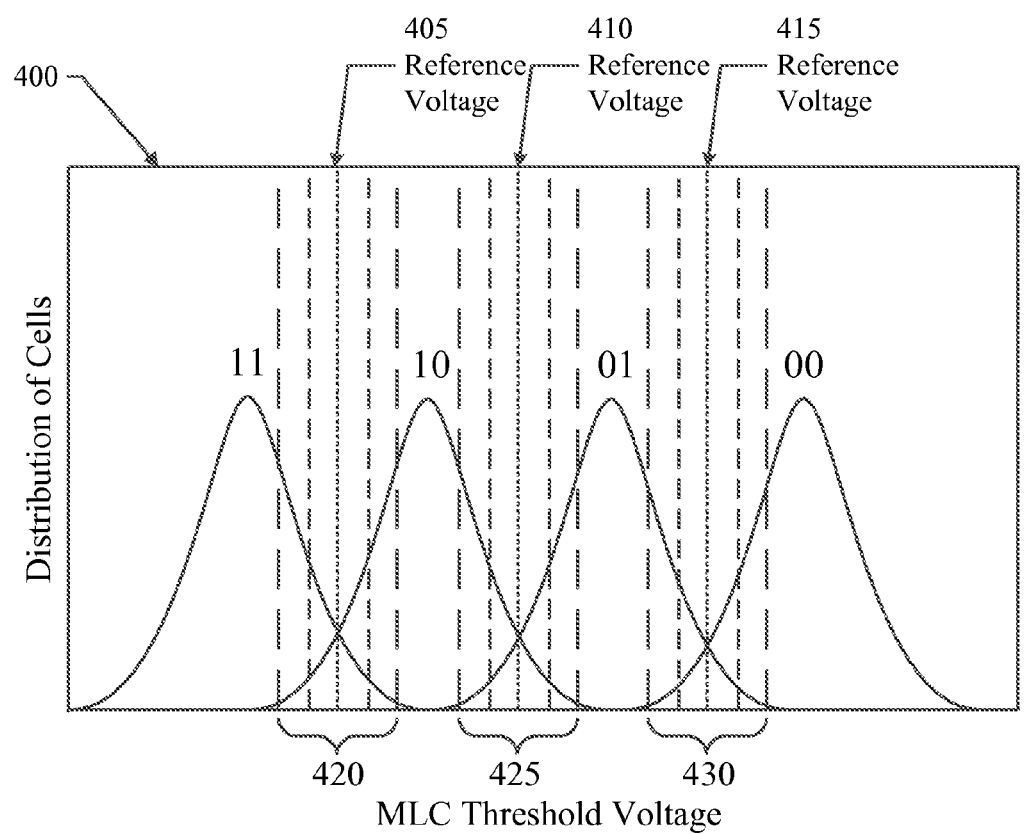
FIG. 4 is a graphical illustration of an overlapping threshold voltage distribution in a multi-level cell.

As shown with reference to FIG. 4, in accordance with an embodiment of the present invention, non-uniform threshold voltage sensing is performed for an MLC cell, wherein the overlap regions 420, 425 and 430 are defined around each of the hard-decision reference voltages 405, 410 and 415 and uniform memory sensing is performed within each of the overlap regions using the plurality of soft-decision reference voltages. In the case of an MLC flash memory, the overlap regions of the threshold voltage distributions for the flash memory cells are divided into a number of partitions, on either side of the hard-decision reference voltage, by moving the read reference voltages. In order to locate each bit without error, more read operations at these soft-decision reference voltages are required. As shown in the graph 400 of FIG. 4, in a specific embodiment, each overlap region 420, 425 and 430 is divided into four partitions, so that each bit (LSB and MSB) is read utilizing 3 bits, where 3 represents the number of soft-decision bits.

As previously described, for LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. In the exemplary embodiment shown in FIG. 4, 3 soft-decision bits are used to identify eight regions, therefore eight LLRs will be extracted from the look-up table to perform the LDPC decoding process. Additionally, every overlap region requires an LLR look-up table, so that in the MLC case illustrated in FIG. 4, three LLR look-up tables are needed to provide the necessary decoding information.

In an alternative embodiment, a single soft-decision reference voltage may be used instead of a plurality of soft-decision references voltages, resulting in only two soft-decision bits. In this embodiment, the soft-decision decoding may be considered hard-decision decoding resulting in a two-state result and therefore, two corresponding LLRs. As with the soft-decision LLRs, these hard-decision LLRs will also change over the lifetime of the device.

As previously described, due to the program/erase wear-out of the flash memory, the bit error rate (BER) of the memory device increases during its lifetime. It follows that the log likelihood ratios (LLRs) of the flash memory device also change over the lifetime of the device, as the LLR values are measures of the reliability of the data read from the memory storage. However, LDPC decoders currently known in the art do not consider the changes in the LLRs associated with the flash memory during the lifetime of the device. Instead, prior art LDPC decoders are designed for a maximum bit error rate that does not change during the memory device lifetime.

LLRs are a function of the shape and location of the threshold voltage distribution for the flash cells and can be computed or measured in a characterization laboratory. In order to provide the LDPC decoder with the correct soft-decision information, the LLR look-up tables used for decoding represent the channel and the BER at that specific point in the lifetime of the flash memory. The threshold voltage distribution for the flash cells changes over the lifetime of the device due to wear-out and as such, the LLRs also change. As such, in order to provide the correct soft-decision information over the lifetime of the flash memory, a plurality of LLR tables are needed that accurately reflect the threshold voltage distributions at various points over the lifetime of the device. For example, a first LLR look-up table would be used for a fresh device, having a BER of around $10^{-6}$ and a second LLR look-up table would be used for the device towards the end of the device lifetime, when the BER is around $10^{-2}$. By utilizing LLR look-up tables that are reflective of the current point in the lifetime of the device, the LLR look-up table will most accurately represent the noise and the LDPC will perform in a quasi-optimal way.

Each flash technology exhibits a unique threshold voltage distribution over its lifetime. As such, a generic law does not exist for determining standard LLR look-up table values for the variety of flash devices available in the market. Instead, in order to characterize the flash device and thereby determine the appropriate lifetime LLR look-up table values, it is necessary to measure billions and billions of flash cell distributions over the lifetime of each flash device to understand how the flash cells will perform. The lifetime threshold voltage distribution will differ among technologies and among vendors. For example, it may be determined that a different LLR look-up table for every decade of BER accurately reflects the behavior of the flash cells over the lifetime of the device. As such, when the BER of the flash device changes from $10^{-4}$ to $10^{-5}$, a different LLR look-up table will be accessed in the flash controller to reflect this characterized change in BER. Additionally, at any single point in time, there may be multiple flash chips of the flash device operating at different points in their lifetime, or perhaps a single flash chip comprising regions that are operating at different points in their lifetime. By performing characterization of the flash device, either by computational techniques and laboratory measurements, a plurality of lifetime LLR look-up tables can be generated for the flash device that accurately reflect the change in the threshold voltage distribution of the flash device over its lifetime. The LLR look-up tables may also reflect changes to specific flash chips of the flash device or specific regions of a flash chip over the lifetime of the device. The plurality of LLR look-up tables are stored in the flash memory controller and in operation, the flash memory controller selects the appropriate LLR look-up table to use for decoding the codeword based upon the present point in the lifetime of the device.

In the present invention, an LLR look-up table need not be a physical entity, but may be considered in a broader sense to be a logical entity. Additionally, the various LLR look-up tables reflecting the current BER of the device may be independent look-up tables or may alternatively be subsets of a larger look-up table.

Typically LLR look-up tables are reflective of threshold voltage distributions that are assumed to be symmetric around the hard-decision threshold voltage, as shown with reference to FIG. 2. This assumption implies that the change in the distributions of the erase and the programmed states are substantially equal over the lifetime of the flash device. However, characterization of the flash device may reveal that, over the device lifetime, the erase cycle distribution of the flash memory tends to widen more rapidly than the programmed distribution. As shown with reference to FIG. 3, over the lifetime of the flash device, an overlap region 310 may be created that is asymmetric and shifted to the right of the reference voltage 305 as a result of the erase distribution "1" widening more rapidly than the programmed distribution "0". This is a common situation in both SLC and MLC NAND-based flash memory devices. In this scenario, utilizing an LLR look-up table that assumes a symmetric distribution for decoding of the data would lead to an increase in decode failures. To overcome this limitation, the present invention proposes an LLR look-up table composed of LLR values that represent this asymmetry in the lifetime threshold distribution.

Figure 3:
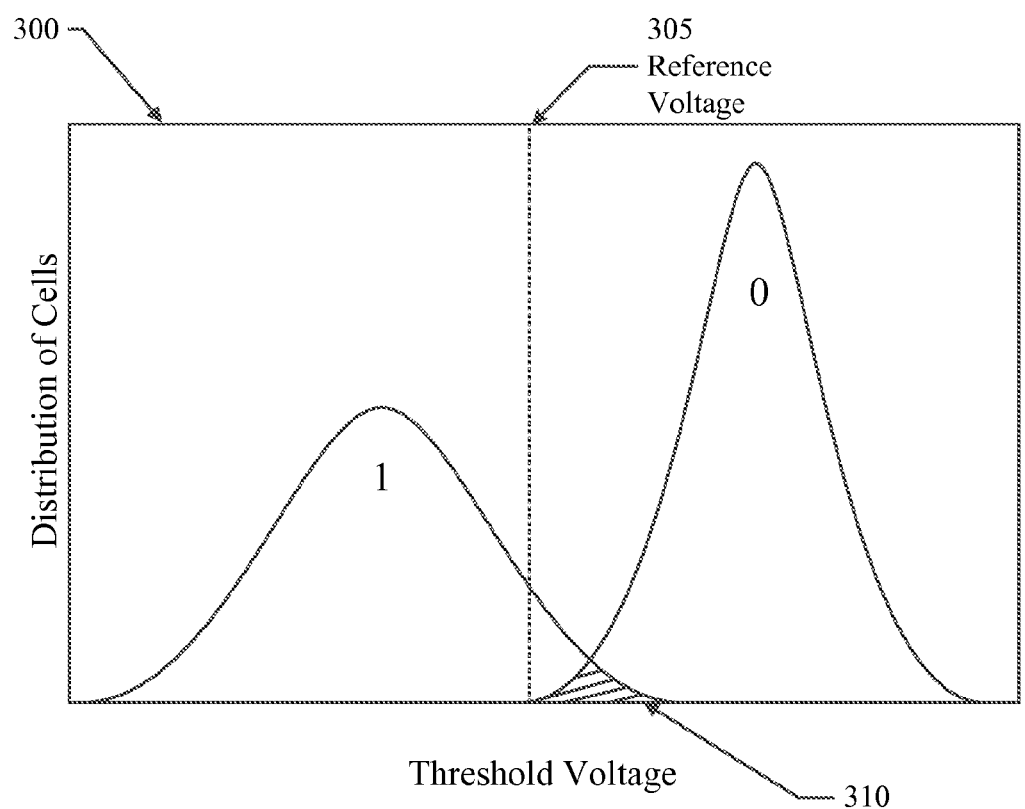
FIG. 3 is a graphical illustration of an asymmetric threshold voltage distribution in a single-level cell.

In an exemplary embodiment of an SLC flash memory device with a BER of $10^{-2}$, assuming the threshold voltage 305 in FIG. 3 is 4.07 and utilizing 3 soft-decision bits to identify the two states of the device, up to 8 LLRs would be required in the LLR look-up table to decode the data. The LLRs may be negative for cells read below the threshold voltage and a positive number for cells read above the threshold voltage, with the magnitude of the number indicating how far the read is from the threshold voltage. Utilizing the prior art method which assumes a symmetric distribution, the LLRs in the table may be, 10.32, 6.58, 2, 0.8, −0.8, −2, −6.58 and −10.32. Utilizing this symmetric LLR look-up table would result in four errors prior to decoding. In contrast, if the asymmetric LLR look-up table of the present invention is used for decoding, having LLRs of 7.19, 5.89, 4.07, 1.63, −1.47, −5.21, −9.61 and −16.56, zero failures will result. As such, it is shown that utilizing a symmetric LLR as known in the prior art will lead to initial failures that will increase the chance of a decode failure, while the use of the asymmetric LLR of the present invention will improve the decoding performance by starting without errors.

Accessing an LLR look-up table comprising LLRs that reflect the current threshold voltage distribution of the flash device, as taught by the present invention, may be used to improve the performance of the LDPC decoder in decoding LDPC encoded data that is stored in a nonvolatile memory system. As shown with reference to FIG. 5, a nonvolatile memory system 500, such as a solid state drive, may include a nonvolatile storage module 515 and a nonvolatile memory controller 505. The nonvolatile memory storage module 515 may comprise a plurality of NAND chips 530. Each of the plurality of NAND chips 530 may be coupled to the nonvolatile memory controller 505 through a plurality of channels 520. In this embodiment, the NAND chips 530 store the encoded codewords and the memory controller 505 is designed to execute reading and writing controls for the NAND chips 530 according to reading and writing instructions received from an access device. The nonvolatile memory controller 505 may further include a plurality of LLR look-up tables 535, each of the plurality of LLR look-up tables 535 representative of the threshold voltage distribution of the memory module at a specific point in the lifetime of the memory module 515. The LLR look-up tables 535 may be representative of a symmetric distribution or an asymmetric distribution. The nonvolatile memory controller 505 further comprises read circuitry 540 for reading the codewords stored in the nonvolatile memory storage module 515.

Figure 5:
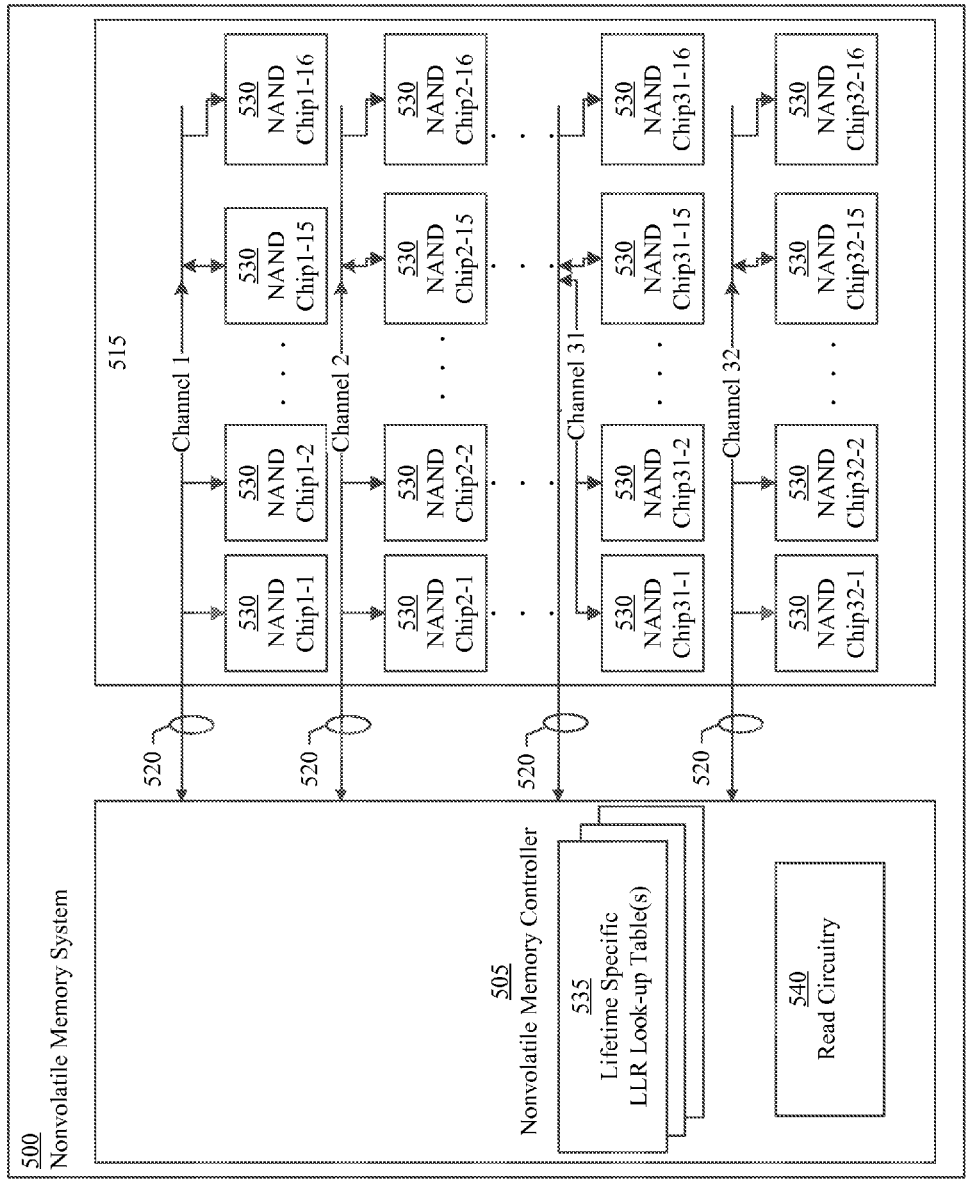
FIG. 5 is a block diagram illustrating a nonvolatile memory system.
Figure 6:
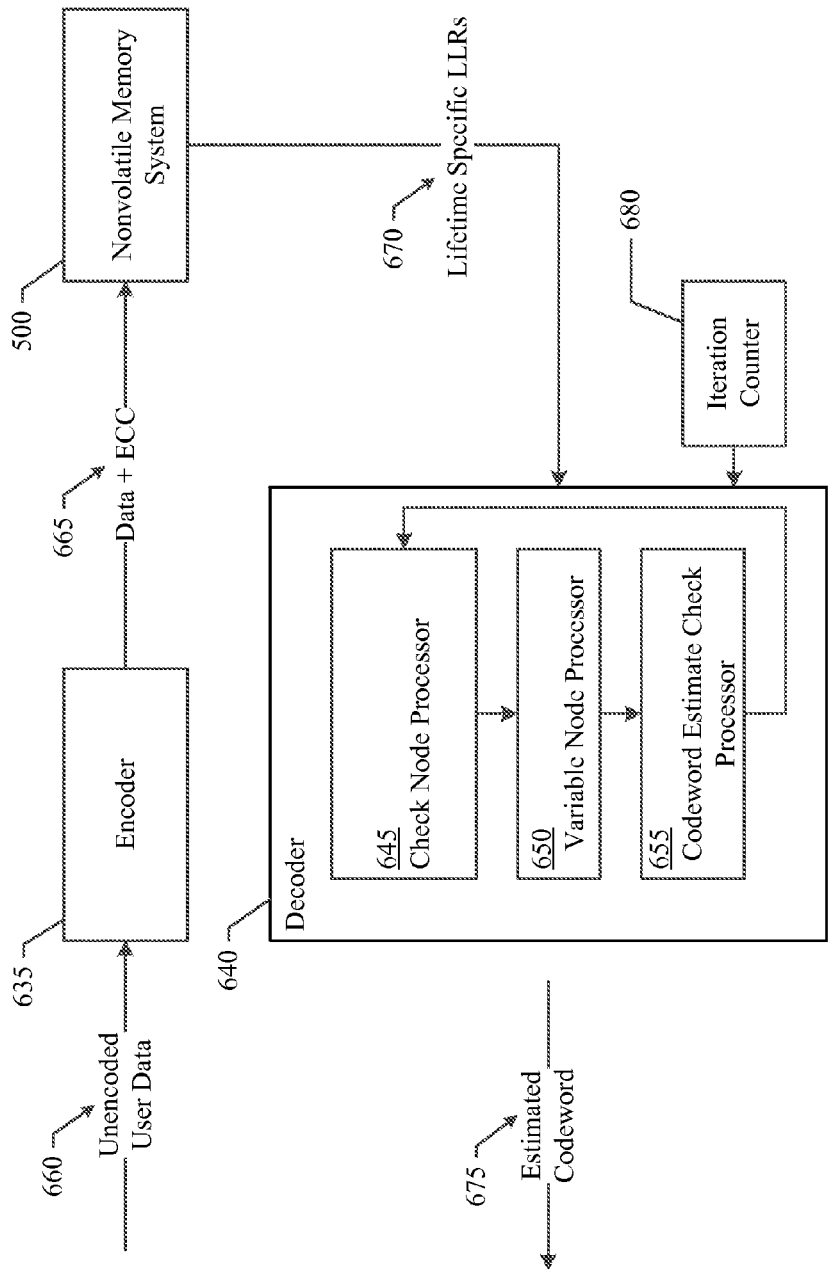
FIG. 6 is a block diagram illustrating LDPC encoding and LDPC decoding in accordance with an embodiment of the present invention.

The nonvolatile memory system 500 of FIG. 5 may be incorporated into a LDPC system as shown with reference to FIG. 6. As shown, the LDPC system may comprise an encoder 635 that is responsible for adding the parity bits to the unencoded user data 660 in accordance with a low-density parity check (LDPC) code. The LDPC encoded data 665, which includes the unencoded user data 660 and an error correction code, may then be stored as encoded codewords in the nonvolatile memory system 500. In a particular embodiment the nonvolatile memory system 500 may include a plurality of NAND chips 530 and a nonvolatile memory controller 505 having a plurality of lifetime specific LLR look-up tables 535 as previously described with reference to FIG. 5.

In a particular embodiment of the present invention, LDPC decoding of the codeword is performed based upon a parity check matrix. The parity check matrix consists of "0"s and "1"s defining the parity check equations. For an "M" row× "N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix.

In operation of the present invention, during a read operation of the nonvolatile memory system 500, multiple reads of the stored codewords are executed to provide soft-decision information represented by lifetime specific LLRs 670 extracted from an LLR look-up table 535 that is specific to the current point in the lifetime of the device. The current point in the lifetime of the device may be identified by the BER of the device or by other means, such as by counting the P/E cycles of the device. The LLRs 670 are used as input to the LDPC decoder 640 to decode the unencoded user message data 660 encoded by the encoder 635, utilizing LDPC coding following a parity check matrix (H). The received LLR values for each variable node are taken as the initial variable node messages. The check node processor 645 updates the check nodes of a first layer with the variable node messages to which they are connected. The resulting messages of the check node processor 645 are then passed to the variable node processor 650 and the variable node processor 650 then updates each variable node with the check node messages to which they are connected. The iterative decoding process continues, as is known in the art, and the resulting codeword estimate is then checked by a codeword estimate check processor 655, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is a valid codeword, the decoding is complete and the estimated codeword is provided as output 675 from the decoder 640. If it is determined by the codeword estimate check processor 655 that the codeword estimate is not a valid codeword, a second iteration of the decoding begins. The iteration counter 680 may be used to track the number of iterations of the decoding process and may cause the decoding to terminate if a maximum number of iterations is reached.

Figure 7:
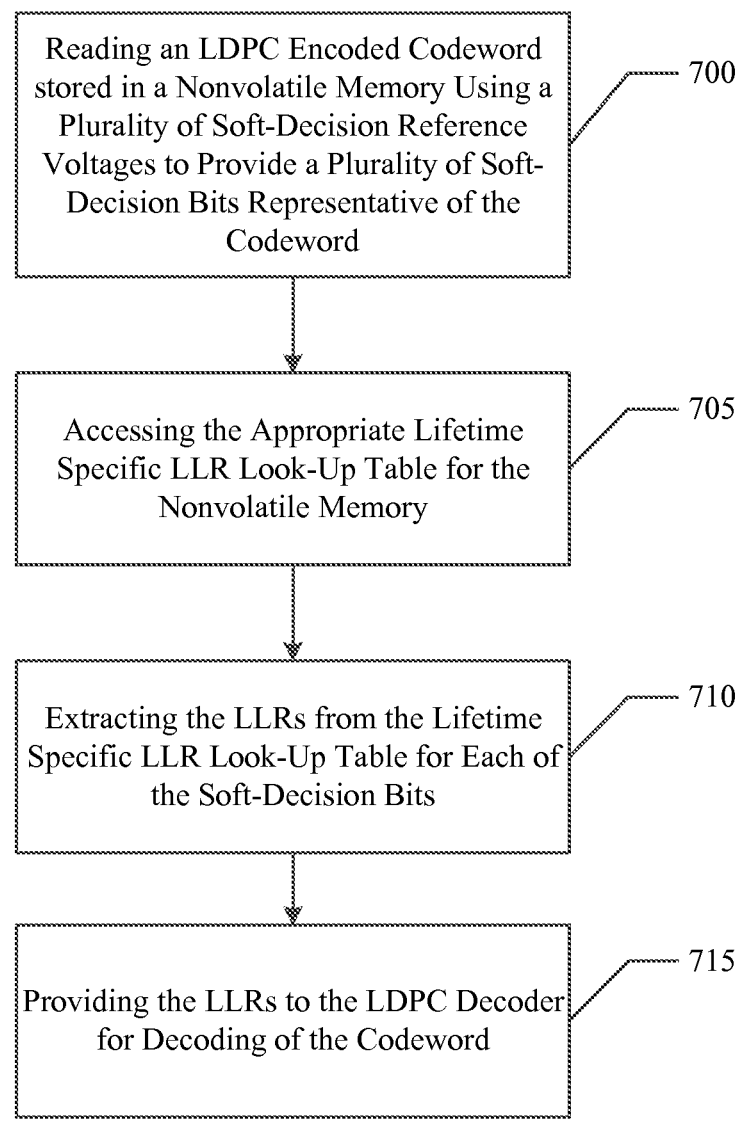
FIG. 7 is a flow diagram illustrating the decoding method in accordance with the present invention.

With reference to FIG. 7, in a particular embodiment of the present invention, lifetime specific LLRs of the LDPC encoded data may be received at an LDPC decoder 600 for decoding of the data. In a particular embodiment, the method of the present invention may include reading a codeword stored in a nonvolatile memory storage module 515 using a plurality of soft-decision reference voltages to provide a plurality of soft-decision bits 700 representative of the stored codeword. The nonvolatile memory storage module 515 may be a flash memory of solid state drive (SSD) comprising a plurality of NAND chips 530. The codeword may be encoded using LDPC encoding techniques. After reading the data, the appropriate lifetime specific LLR look-up table 535 can be accessed 705 based upon the current point in the lifetime of the nonvolatile memory storage module 515 and the LLRs for each of the soft-decision bits can then be extracted from the lifetime specific LLR look-up table 710. The lifetime specific LLR look-up table 535 may be stored in the nonvolatile memory controller 505. The LLRs from the lifetime specific LLR look-up table can then be provided to the decoder for decoding of the codeword 715.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of providing log likelihood ratios (LLRs) to a low-density parity check (LDPC) decoder, the method comprising:
    storing a plurality of lifetime specific LLR look-up tables for a nonvolatile memory storage module, each of the lifetime specific LLR tables including LLRs representative of a threshold voltage distribution of flash chips of the nonvolatile memory storage module at a point in the lifetime of the nonvolatile memory storage module;
    reading an LDPC encoded codeword stored in the nonvolatile memory storage module using a plurality of soft-decision reference voltages to provide a plurality of soft-decision bits representative of the codeword;
    identifying a current point in the lifetime of the nonvolatile memory storage module based on the current bit error rate (BER) of one or more of the flash chips of the nonvolatile memory storage module;
    selecting a current lifetime specific LLR look-up table from the plurality of lifetime specific LLR look-up tables based upon the identified current point in the lifetime of the nonvolatile memory storage module;
    extracting the LLRs from the current lifetime specific LLR look-up table for each of the soft-decision bits; and
    providing the extracted LLRs to an LDPC decoder for decoding of the codeword.

2. The method of claim 1, wherein the nonvolatile memory storage module is a NAND-based flash memory module.

3. The method of claim 1, wherein the nonvolatile memory storage module is selected from the group consisting of a single-level cell (SLC) memory storage module, a multi-level cell (MLC) memory storage module and a triple-level (TLC) memory storage module.

4. The method of claim 1, further comprising generating the plurality of lifetime specific LLR look-up tables, each of the lifetime specific LLR tables including the LLRs representative of a threshold voltage distribution of one or more of the plurality of individual flash chips at a point in the lifetime of the one or more of the plurality of individual flash chips.

5. The method of claim 1, wherein the nonvolatile memory storage module comprises a plurality of specific regions comprising one or more individual flash chips and wherein one or more of the plurality of lifetime specific LLR look-up tables comprises LLRs representative of a threshold voltage distribution at a point in the lifetime of one more of the plurality of specific regions.

6. The method of claim 1, wherein the plurality of soft-decision reference voltages are determined by non-uniform partitioning of a threshold voltage distribution associated with the nonvolatile memory storage module.

7. The method of claim 1, wherein reading the LDPC encoded codeword further comprises:
    identifying at least one hard-decision reference voltage in a threshold voltage distribution associated with the nonvolatile memory storage module;
    identifying an overlap region around each of the at least one hard-decision reference voltages;
    partitioning the overlap region into a plurality of threshold voltage ranges, each threshold voltage range bounded by two soft-decision reference voltages to establish non-uniform partitioning of the threshold voltage distribution;
    applying the soft-decision reference voltages to a cell of the nonvolatile memory storage module; and
    sensing a voltage level of the cell.

8. The method of claim 1, wherein the lifetime specific LLR look-up table is asymmetric.

9. The method of claim 1, wherein the plurality of soft-decision reference voltages is equal to one and the plurality of soft-decision bits representative of the codeword is equal to two.

10. A nonvolatile memory controller for providing log likelihood ratios (LLRs) for low-density parity check (LDPC) decoding, the controller comprising:
    circuitry for storing a plurality of lifetime specific LLR look-up tables representative of the lifetime threshold voltage distribution of a nonvolatile memory storage module, each of the plurality of lifetime specific LLR look-up tables including LLRs representative of threshold voltage distributions of flash chips of the nonvolatile memory storage module at a point in the lifetime of the nonvolatile memory storage module;
    read circuitry for reading an LDPC encoded codeword stored in the nonvolatile memory storage module using a plurality of soft-decision reference voltages and for identifying a plurality of soft-decision bits representative of the codeword;
    circuitry for identifying a current point in the lifetime of the nonvolatile memory storage module based on the current bit error rate (BER) of one or more of the flash chips of the nonvolatile memory storage module; and
    circuitry for selecting a current lifetime specific LLR look-up table from the plurality of lifetime specific LLR look-up tables for the nonvolatile memory storage module based upon the identified current point in the lifetime of the nonvolatile memory storage module.

11. The controller of claim 10, wherein the nonvolatile memory storage module is a NAND-based flash memory module.

12. The controller of claim 10, wherein the nonvolatile memory storage module is selected from the group consisting of a single-level cell (SLC) memory storage module, a multi-level cell (MLC) memory storage module and a triple-level cell (TLC) memory storage module.

13. The controller of claim 10, wherein at least one of the plurality of lifetime specific LLR look-up tables represents each decade of bit error rate (BER) of the lifetime of the nonvolatile memory storage module.

14. The controller of claim 10, wherein the nonvolatile memory storage module comprises a plurality of specific regions comprising one or more individual flash chips and wherein one or more of the plurality of lifetime specific LLR look-up tables comprises LLRs representative of a threshold voltage distribution at a point in the lifetime of one or more of the plurality of specific regions.

15. The controller of claim 10, wherein the plurality of soft-decision reference voltages are determined by non-uniform partitioning of a threshold voltage distribution associated with the nonvolatile memory storage module.

16. The controller of claim 10, wherein the read circuitry further comprises circuitry for identifying at least one hard-decision reference voltage in a threshold voltage distribution associated with the nonvolatile memory storage module, identifying an overlap region around each of the at least one hard-decision reference voltages, partitioning the overlap region into a plurality of threshold voltage ranges, each threshold voltage range bounded by two soft-decision reference voltages to establish non-uniform partitioning of the threshold voltage distribution, applying the soft-decision reference voltages to a cell of the nonvolatile memory storage module and sensing a voltage level of the cell.

17. The controller of claim 10, further comprising, circuitry to extract the LLRs from the current lifetime specific LLR look-up table for each of the soft-decision bits and to provide the extracted LLRs to an LDPC decoder for decoding of the codeword.

18. The controller of claim 10, wherein at least one of the plurality of lifetime specific LLR look-up tables is asymmetric.

19. A nonvolatile memory controller for providing log likelihood ratios (LLRs) for low-density parity check (LDPC) decoding, the controller comprising:
   circuitry for storing a plurality of lifetime specific LLR look-up tables representative of the lifetime threshold voltage distribution of a nonvolatile memory storage module, each of the plurality of lifetime specific LLR look-up tables including LLRs representative of threshold voltage distributions of flash chips of the nonvolatile memory storage module at a point in the lifetime of the nonvolatile memory storage module, at least one of the plurality of lifetime specific LLR look-up tables representing each decade of bit error rate (BER) of the lifetime of the nonvolatile memory storage module;
   read circuitry for reading an LDPC encoded codeword stored in the nonvolatile memory storage module using a plurality of soft-decision reference voltages and for identifying a plurality of soft-decision bits representative of the codeword;
   circuitry for identifying a current point in the lifetime of the nonvolatile memory storage module based on the current bit error rate (BER) of one or more of the flash chips of the nonvolatile memory storage module;
   circuitry for selecting a current lifetime specific LLR look-up table from the plurality of lifetime specific LLR look-up tables for the nonvolatile memory storage module based upon the identified current point in the lifetime of the nonvolatile memory storage module; and
   circuitry to extract the LLRs from the current lifetime specific LLR look-up table for each of the soft-decision bits and to provide the extracted LLRs to an LDPC decoder for decoding of the codeword.

20. The controller of claim 19, wherein at least one of the plurality of lifetime specific LLR look-up tables is asymmetric.

21. A nonvolatile memory system comprising:
   a nonvolatile memory storage module;
   read circuitry coupled to the nonvolatile memory storage module for reading a low-density parity check (LDPC) encoded codeword stored in the nonvolatile memory storage module using a plurality of soft-decision reference voltages and for identifying a plurality of soft-decision bits representative of the codeword;
   a plurality of lifetime specific log likelihood ratio (LLR) look-up tables representative of the lifetime threshold voltage distribution of the nonvolatile memory storage module, the plurality of lifetime specific LLR look-up tables stored in the nonvolatile memory system, each of the plurality of lifetime specific LLR look-up tables including a plurality of LLRs representative of a specific point in the lifetime of the nonvolatile memory storage module;
   circuitry coupled to the nonvolatile memory storage module for identifying a current point in the lifetime of the nonvolatile memory storage module based on the current BER of the nonvolatile memory storage module;
   circuitry for selecting a current lifetime specific LLR look-up table from the plurality of lifetime specific LLR look-up tables for the nonvolatile memory storage module based upon the identified current point in the lifetime of the nonvolatile memory storage module; and
   circuitry coupled to the nonvolatile memory storage module to extract the LLRs from the lifetime specific LLR look-up table for each of the soft-decision bits and to provide the extracted LLRs to an LDPC decoder for decoding of the codeword.

22. The controller of claim 19, wherein at least one of the plurality of lifetime specific LLR look-up tables is asymmetric.

* * * * *